(12) United States Patent
Cheong et al.

(10) Patent No.: US 8,563,356 B2
(45) Date of Patent: Oct. 22, 2013

(54) THIN FILM TRANSISTOR AND METHOD OF FABRICATING THE SAME

(75) Inventors: Woo Seok Cheong, Daejeon (KR); Sung Mook Chung, Gyeonggi-do (KR); Jun Yong Bak, Busan (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 195 days.

(21) Appl. No.: 12/887,282

(22) Filed: Sep. 21, 2010

(65) Prior Publication Data

US 2011/0140097 A1    Jun. 16, 2011

(30) Foreign Application Priority Data

Dec. 11, 2009   (KR) .................... 10-2009-0122990

(51) Int. Cl.
*H01L 21/00*    (2006.01)

(52) U.S. Cl.
USPC ............... 438/104; 438/85; 438/86; 438/754; 257/43

(58) Field of Classification Search
USPC ........................................... 257/43
See application file for complete search history.

(56) References Cited

U.S. PATENT DOCUMENTS

| | | | |
|---|---|---|---|
| 5,712,494 A * | 1/1998 | Akiyama et al. | 257/59 |
| 7,304,331 B2 | 12/2007 | Saito et al. | |
| 7,564,055 B2 | 7/2009 | Hoffman | |
| 7,910,920 B2 | 3/2011 | Park et al. | |
| 2005/0017244 A1 | 1/2005 | Hoffman et al. | |
| 2009/0166616 A1* | 7/2009 | Uchiyama | 257/43 |
| 2010/0155716 A1* | 6/2010 | Cheong et al. | 257/43 |
| 2011/0042670 A1 | 2/2011 | Sato et al. | |

FOREIGN PATENT DOCUMENTS

| | | |
|---|---|---|
| JP | 06-291318 A | 10/1994 |
| JP | 2000-228516 A | 8/2000 |
| JP | 2001-322814 A | 11/2001 |
| JP | 2007-073705 A | 3/2007 |
| JP | 2009-043920 A | 2/2009 |
| JP | 2009-272427 A | 11/2009 |
| JP | 2011124532 A * | 6/2011 |
| KR | 10-2006-0132659 | 12/2006 |
| KR | 10-2008-0076608 | 8/2008 |

OTHER PUBLICATIONS

H.Q. Chiang et al., "High mobility transparent thin-film transistor with amorphous zinc tin oxide channle layer", Applied Physics Letters 86, 013503-3(2005).
M.G. McDowell et al., "Combinatorial study of zinc tin oxide thin-film transistors", Applied Physics Letters 92, 013502-1 to 013502-3 (2008).

* cited by examiner

*Primary Examiner* — Ajay K Arora
(74) *Attorney, Agent, or Firm* — Rabin & Berdo, P.C.

(57) ABSTRACT

Provided are a thin film transistor in which an oxide semiconductor combined with a nitride containing boron or aluminum is applied to a channel layer and a method of fabricating the same. The thin film transistor in which an oxide semiconductor combined with a nitride containing boron or aluminum is applied to a channel layer exhibits significantly improved mobility and increased stability at a high temperature.

8 Claims, 5 Drawing Sheets

THIN FILM TRANSISTOR AND METHOD OF FABRICATING THE SAME

CROSS-REFERENCE TO RELATED APPLICATION

This application claims priority to and the benefit of Korean Patent Application No. 10-2009-0122990, filed Dec. 11, 2009, the disclosure of which is incorporated herein by reference in its entirety.

BACKGROUND

1. Field of the Invention

The present invention relates to a thin film transistor and a method of fabricating the same, and more particularly, to an oxide thin film transistor in which a semiconductor thin film formed by combining an oxide semiconductor with a specific nitride is applied to a channel layer of a thin film transistor and a method of a fabricating the same.

2. Discussion of Related Art

In fabricating a thin film transistor, materials used to form a channel layer largely include silicon-based materials, ZnO-based materials, and non-ZnO-based materials. A detailed description of these materials will be provided below.

(1) Silicon-Based Material

Devices based on amorphous silicon and polycrystalline silicon are being realized. While mobility of an amorphous silicon transistor is as low as 1 cm/Vs, and that of a polycrystalline silicon transistor is as high as 100 cm/Vs, problems of device uniformity are on the rise.

(2) ZnO-Based Material

In order to enhance performance when a channel layer is formed using a ZnO-based material, methods of adjusting a ratio of zinc to oxygen (Zn/O) have been developed. Such methods include, for example, a structural approach in which a band-gap is adjusted by substituting La, Ba, Sr, etc., and adjustment through post-processes including low-temperature annealing and laser annealing.

Also, research aimed at improving deteriorated characteristics resulting from a polycrystalline structure of ZnO in a ZnO-based material is underway. For example, the characteristics of single crystallization are improved through a grain growth method and a low-temperature molecular beam epitaxy (MBE) process, and the characteristics of amorphization are improved using quaternary materials including indium, gallium, zinc, and oxygen. However, the quaternary materials including indium, gallium, zinc, and oxygen have been patented by Hosono, Japan, and thus use of them may require a license.

There has been extensive research into the improvement of characteristics by adjusting the concentration of N-type and P-type carriers when a channel layer is formed using a ZnO-based material. For example, a single-element doping method or a droplet (or drop) implantation method may be employed, a ternary compound semiconductor, e.g., ZnSnO, MgZnO or CdZnO may be used, and there is plenty of room for more research regarding additional substitutions in ternary compound semiconductors.

(3) Non-ZnO-Based Material

Non-ZnO-based materials include In—Ga—Zn—O type amorphous semiconductor and individual oxide semiconductors such as $In_2O_3$ and $SnO_2$. The In—Ga—Zn—O type amorphous semiconductor is unlikely to be free from the original patent of Hosono. While individual oxide semiconductors such as $In_2O_3$ and $SnO_2$ have inferior characteristics to ZnO, they have not undergone sufficient research and there is room for improvement of their characteristics by composition adjustment and doping substitution. Non-ZnO-based materials include opaque semiconductors such as CdS, ZnS, ZnSe, etc., whose characteristics are applicable to active matrix organic light emitting diodes (AM OLED), but whose opacity is technically restrictive.

As described above, thin film transistors using silicon-based materials, ZnO-based materials, and non-ZnO-based materials exhibit the following problems.

A ZnO-based thin film transistor's characteristics are susceptible to changes in humidity, annealing processes, and manufacturing processes, and thus it has problems of reliability. Further, the transistor has a crystalline channel which may raise problems of device uniformity. Moreover, device deformation caused by current and light may be significant.

Further, in the case of a thin film transistor employing an IGZO channel in which indium and gallium oxides are applied to ZnO, indium and gallium are relatively scarce and therefore costly materials.

In a silicon-based thin film transistor, in particular, amorphous silicon, mobility is low, and with polycrystalline silicon, uniformity may be a problem in creation of a large panel. In particular, the amorphous silicon transistor is vulnerable to instability depending on current.

In general, an oxide thin film transistor may be vulnerable to instability depending on current due to the inside of a channel thin film or an interface with a gate insulating layer.

In addition, a thin film transistor using ZnS, ZnSe, CdS, etc. is opaque and thus may not be applicable to transparent electronic devices.

In the course of research into thin film transistors, the present inventors found that when an oxide semiconductor is combined with a specific nitride to form a channel layer, mobility is increased and stability is ensured at a high temperature. These findings led to the completion of the present invention.

SUMMARY OF THE INVENTION

The present invention is directed to a thin film transistor capable of ensuring increased mobility and stability at a high temperature by applying a semiconductor thin film formed of an oxide semiconductor combined with a specific nitride to a channel layer.

The present invention is also directed to a method of fabricating a thin film transistor capable of ensuring increased mobility and stability at a high temperature by optimizing a fabricating process including forming a semiconductor thin film formed of an oxide semiconductor combined with a specific nitride as a channel layer.

An aspect of the present invention provides a thin film transistor comprising source and drain electrodes, a channel layer, a gate insulating layer and a gate electrode disposed on a substrate, the channel layer including an oxide semiconductor combined with a nitride containing boron or aluminum.

The transistor may further include a channel protection layer formed of at least one insulating material selected from the group consisting of AlOx, SiNx and SiOx on the channel layer.

The thin film transistor may have a top gate coplanar structure in which source and drain electrodes, a channel layer, a gate insulating layer and a gate electrode are sequentially stacked on a substrate, a top gate staggered structure in which a channel layer, source and drain electrodes, a gate insulating layer and a gate electrode are sequentially stacked on a substrate, a bottom gate coplanar structure in which a gate electrode, a gate insulating layer, source and drain electrodes and a channel layer are sequentially stacked on a substrate or a bottom gate staggered structure in which a gate electrode, a gate insulating layer, a channel layer and source and drain electrodes are sequentially stacked on a substrate.

The oxide semiconductor used for the channel layer may be formed of at least one selected from the group consisting of ZnO, In—Zn—O, Zn—Sn—O, In—Ga—ZnO, Zn—In—Sn—O, In—Ga—O and $SnO_2$, the nitride containing boron or aluminum may include BN or AlN, and the nitride containing boron or aluminum may be included such that the boron or aluminum may exist within a range of 0.01 to 50 at % on the basis of the total atomic weight of metal atoms of an oxide semiconductor constituting the semiconductor thin film.

The gate insulating layer may be formed of at least one insulating material selected from the group consisting of AlOx, SiNx and SiOx.

Another aspect of the present invention provides a method of fabricating a thin film transistor, comprising: forming source and drain electrodes, a channel layer, a gate insulating layer and a gate electrode on a substrate, the channel layer being formed of a semiconductor thin film formed of an oxide semiconductor combined with a nitride containing boron or aluminum; and patterning the channel layer.

The method may further include forming a channel protection layer on the channel layer using an insulating material, the channel protection layer being patterned together with the channel layer.

While the channel layer is formed, the oxide semiconductor may be formed of at least one material selected from the group consisting of ZnO, In—Zn—O, Zn—Sn—O, In—Ga—ZnO, Zn—In—Sn—O, In—Ga—O and $SnO_2$, and the nitride containing boron or aluminum may be included such that the boron or aluminum may exist within a range of 0.01 to 50 at % on the basis of the total atomic weight of metal atoms of an oxide semiconductor constituting the semiconductor thin film.

While the channel layer is formed, the channel layer may be formed by depositing the oxide semiconductor combined with the nitride to a thickness of 5 to 100 nm by sputtering, pulsed laser deposition (PLD) or ion-beam deposition at a temperature of room temperature to 300° C., and by performing post-annealing at a temperature below 600° C.

The channel protection layer may be formed to a thickness of 1 nm to 20 nm using at least one material selected from the group consisting of AlOx, SiNx and SiOx by chemical vapor deposition (CVD), atomic layer deposition (ALD) or sputtering method.

While the channel layer or the channel protection layer is patterned, the patterning may be performed using photoresist, etching may be performed by dry or wet etching or ion milling or by fabricating a lift-off pattern using the photoresist, and the photoresist may be applied at a temperature lower that 150° C.

The gate insulating layer may be formed using at least one insulating material selected from the group consisting of AlOx, SiNx and SiOx by ALD.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Figure 1A:
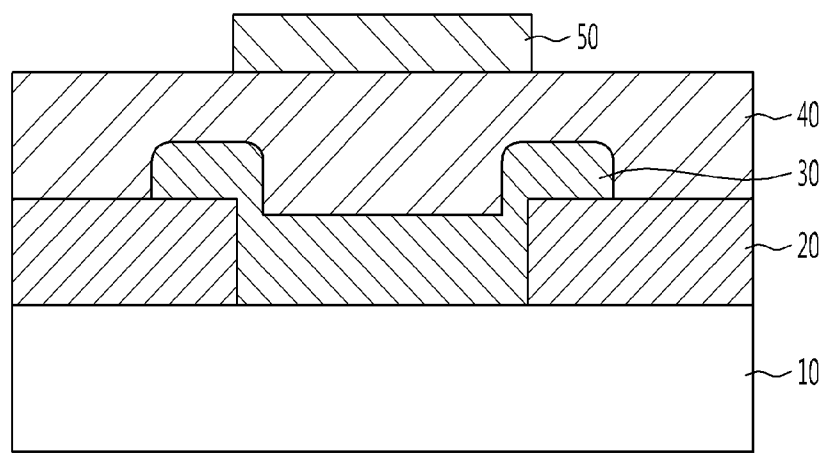
FIGS. 1A to 1D are cross-sectional views of a structure of a thin film transistor according to one exemplary embodiment of the present invention.
Figure 1B:
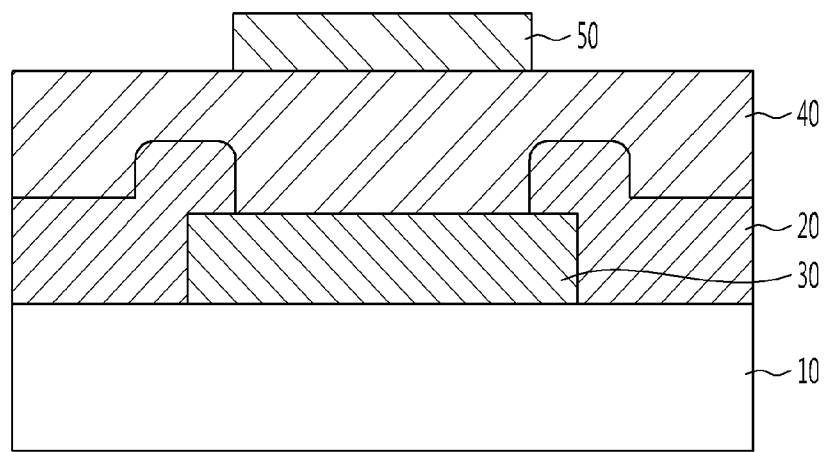
Figure 1C:
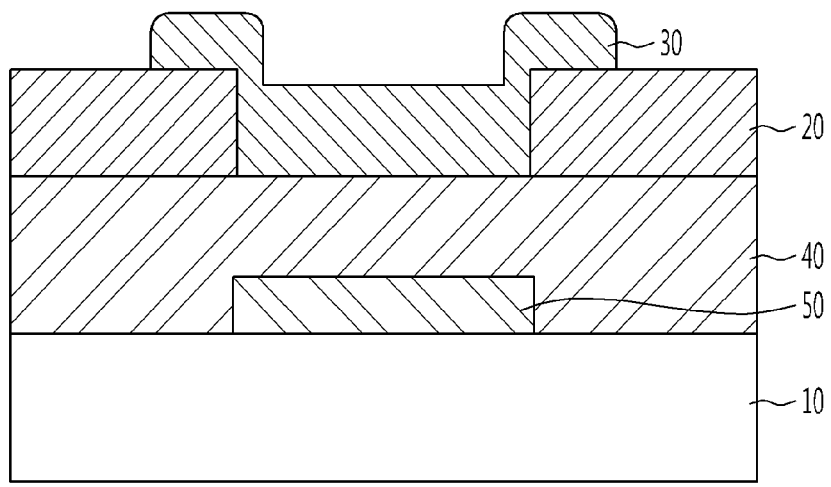
Figure 1D:
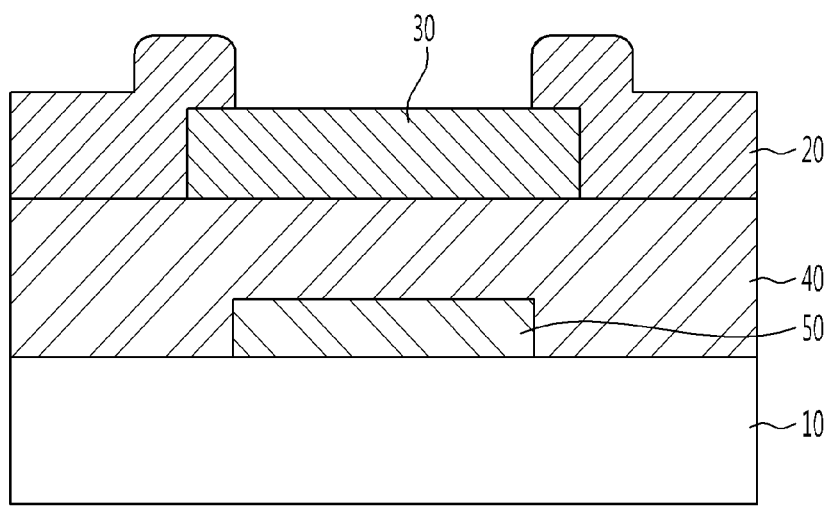

The present invention will be described more fully hereinafter with reference to the accompanying drawings, in which exemplary embodiments of the invention are shown. This invention may, however, be embodied in different forms and should not be construed as limited to the embodiments set forth herein. In the following description of the present invention, a detailed description of known functions and components incorporated herein will be omitted when it may make the subject matter of the present invention rather unclear. It should be noted that the same reference numbers are used in the figures to denote the same elements.

As illustrated in FIGS. 1A to 1D, a thin film transistor according to the present invention may constitute a top gate thin film transistor having a coplanar structure in which source and drain electrodes 20, a channel layer 30, a gate insulating layer 40 and a gate electrode 50 are sequentially stacked on a substrate 10 or an inverted staggered structure in which a channel layer 30, source and drain electrodes 20, a gate insulating layer 40 and a gate electrode 50 are sequentially stacked on a substrate 10. Further, it may constitute a bottom gate thin film transistor having a coplanar structure in which a gate electrode 50, a gate insulating layer 40, source and drain electrodes 20 and a channel layer 30 are sequentially stacked on a substrate 10 or a staggered structure in which a gate electrode 50, a gate insulating layer 40, a channel layer 30, and source and drain electrodes 20 are sequentially stacked on a substrate 10.

As illustrated in FIGS. 2A to 2D, a thin film transistor according to another exemplary embodiment of the present invention further includes a channel protection layer A on a channel layer 30.

Figure 2A:
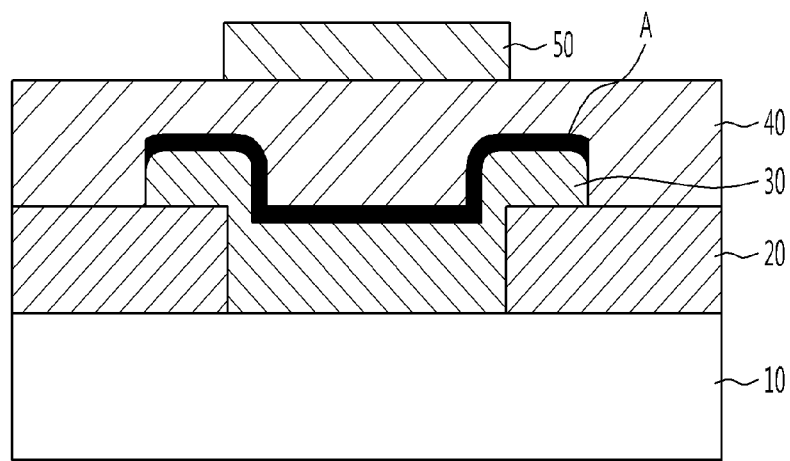
FIGS. 2A to 2D are cross-sectional views of a structure of a thin film transistor according to another exemplary embodiment of the present invention.
Figure 2B:
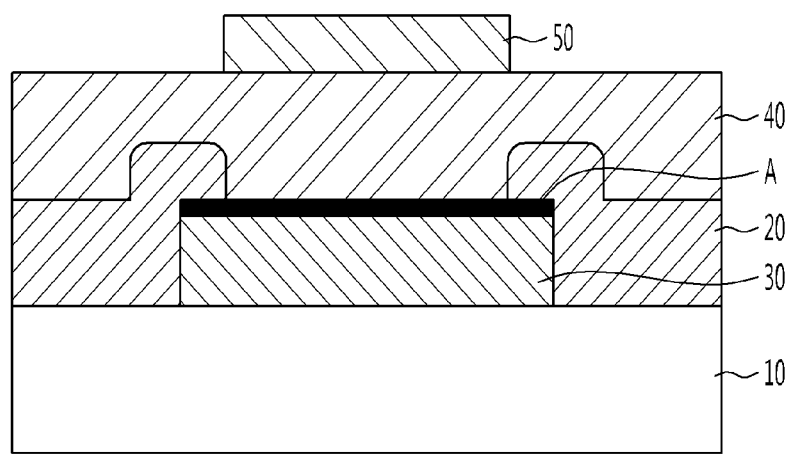
Figure 2C:
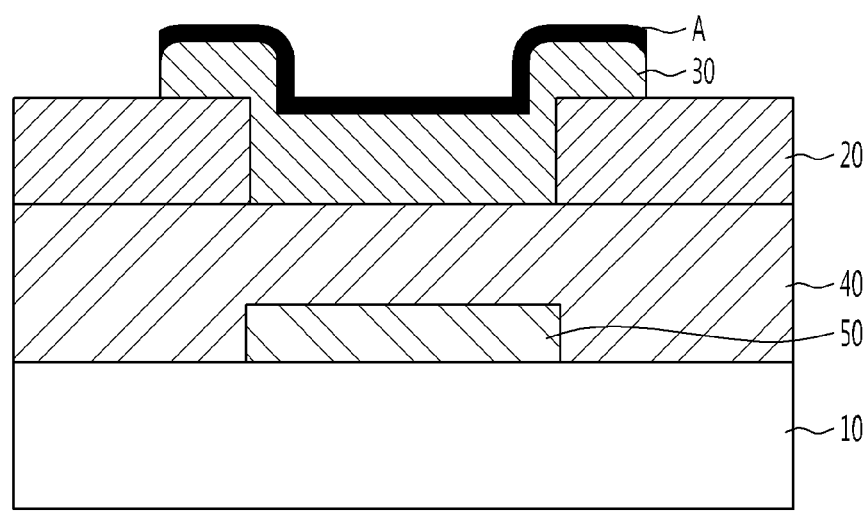
Figure 2D:
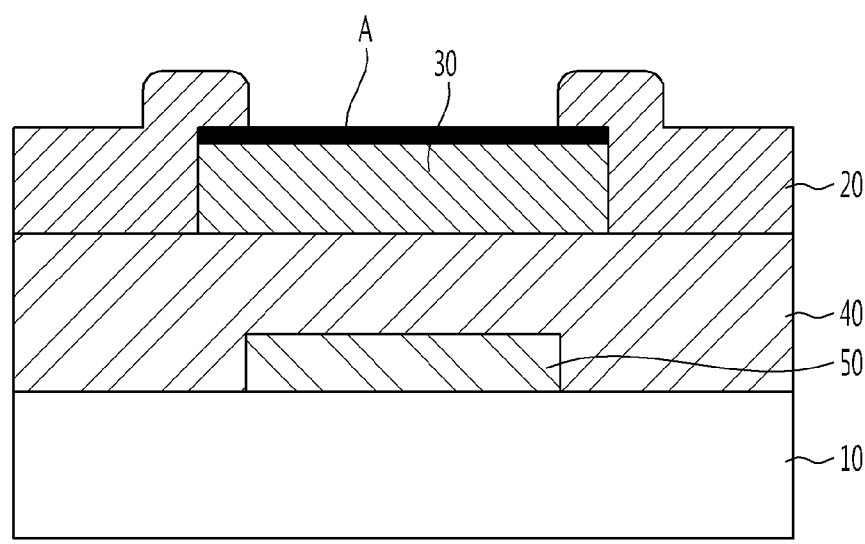

Each layer will be described in detail with reference to FIG. 2A for convenience. Referring to FIG. 2, a thin film transistor according to the present invention includes source and drain electrodes 20, a channel layer 30, a channel protection layer A, a gate insulating layer 40 and a gate electrode 50 on a substrate 10.

The substrate 10 may be one generally used in this field of art, and for example, may be one selected from glass, metal foil, plastic and silicon.

While a transparent oxide such as ITO, IZO, ZnO:Al(Ga), etc., a metal such as Al, Cr, Au, Ag, Ti, etc., or a conductive polymer may be used as the source and drain electrodes 20 formed on the substrate 10, the present invention is not limited thereto. Moreover, the source and drain electrodes 20 may form a double-layer structure of the metal and the oxide. The source and drain electrodes 20 are deposited to a normal thickness using a process such as sputtering, atomic layer deposition (ALD) and chemical vapor deposition (CVD), and then the results are patterned.

The channel layer 30 formed in a channel region on the substrate 10 and the source and drain electrodes 20 is deposited to a thickness of 5 nm to 100 nm using an oxide semiconductor combined with a nitride containing boron or aluminum.

Deposition may be performed using a normal deposition method used in this field, and more preferably, sputtering, pulsed laser deposition (PLD) or ion-beam deposition may be employed. While the sputtering deposition is performed, an oxide target combined with a nitride may be used, and a nitride target and an oxide target may be separately mounted to simultaneously perform sputtering. Nitride powder and oxide power may be sufficiently mixed and the results may be sintered at a temperature of 900° C. to 1500° C. to fabricate a target. In this case, a sintering temperature and atmosphere may vary depending on types of powder and an amount thereof, and the sintering may be performed under an oxygen, nitrogen or vacuum atmosphere.

The channel layer 30 may be deposited at a temperature of 450° C. or lower, and more preferably, may be deposited at room temperature to 300° C. A post-annealing process may be performed at a temperature of 600° C. or lower, and more preferably, may be performed at a temperature of 300° C. to 600° C.

The oxide semiconductor may include a zinc oxide-, tin oxide-, indium oxide-, or gallium oxide-based semiconductor, and more preferably, it may include ZnO, In—Zn—O ($In_2O_3$—ZnO), Zn—Sn—O(ZnO—$SnO_2$), Zn—In—Sn—O(ZnO—$In_2O_3$—$SnO_2$), In—Ga—Zn—O($In_2O_3$—$Ga_2O_3$—ZnO), In—Ga—O($In_2O_3$—$Ga_2O_3$) or $SnO_2$.

BN or AlN may be used as the nitride containing boron or aluminum combined with the oxide semiconductor, and boron nitride or aluminum nitride may be included such that boron or aluminum exists within a range of 0.01 to 50 at % on the basis of the total atomic weight of metal atoms of a metal oxide constituting the semiconductor thin film. The addition of the BN or AlN may result in improved stability at a high temperature in addition to increased mobility.

The channel protection layer A may be selectively formed on the channel layer 30. The channel protection layer A may be formed to protect the channel layer from being etched, may be formed to a thickness of 1 nm to 20 nm, and may be formed of an insulating material such as AlOx, SiNx or SiOx The channel protection layer A may be formed using CVD, ALD, or sputtering.

The channel layer 30 or the channel layer 30 and the channel protection layer A may be patterned using ion milling, dry etching, wet etching or lift-off.

The lift-off may be performed by forming a lift-off pattern using photoresist, and here, the photoresist is vulnerable to a deposition temperature, and thus may be applied at a temperature below 150° C.

The gate insulating layer 40 partially forming at least an interface with the channel layer 30 may be formed by depositing alumina, silicon nitride or silicon oxide at a temperature of 450° C. or lower. The alumina may be deposited using ALD, plasma enhanced chemical vapor deposition (PECVD) or metalorganic chemical vapor deposition (MOCVD) at a temperature of 100° C. to 250° C. In the case of a low temperature process, the silicon nitride (SiNx) or silicon oxide (SiOx) may be deposited using PECVD at a temperature of 100° C. to 300° C., and in the case of a high temperature process, a temperature below 500° C. may be applied. After the gate insulating layer 40 is formed, a post-annealing process may be performed at a temperature of 200° C. to 300° C. for stability.

While a transparent oxide such as ITO, IZO or ZnO:Al (Ga), various kinds of metals exhibiting a low resistance such as Ti, Ag, Au, Al, Cr, Al/Cr/Al or Ni, or a conductive polymer may be used as the gate electrode 50 formed on the gate insulating layer 40, the present invention is not limited hereto.

The gate electrode 50 is deposited to a normal thickness in this field using sputtering, ALD or CVD, and then is patterned.

While the present invention will be further specified with reference to exemplary embodiments, the present invention is not limited to the exemplary embodiments provided below.

Embodiment 1

Figure 3:
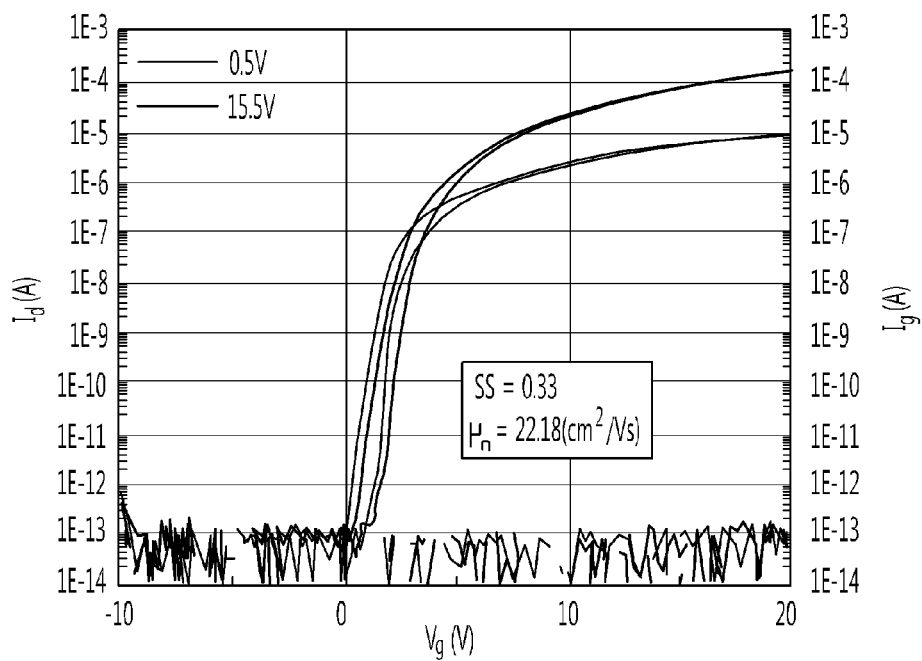
FIG. 3 is a transfer plot of a thin film transistor fabricated from Embodiment 1.

Source and drain electrodes were deposited to a thickness of 150 nm on a substrate by sputtering using ITO, and then patterned by etching at a temperature of 50° C. using a mixture solution of phosphoric acid and nitric acid. Afterwards, Zn—In—Al—O—N (Zn:In:Al atomic ratio=2:2:1) combined with aluminum nitride (AlN) was deposited on the source and drain electrodes by sputtering at room temperature to form a Zn—In—O channel layer combined with AlN formed to a thickness of 20 nm Then, the resulting structure was annealed at a temperature of 400° C. for one hour. Then, a channel protection layer was formed to a thickness of 10 nm on the channel layer using alumina. Subsequently, the channel layer and the channel protection layer were wet etched using a diluted HF solution to be patterned. Then, alumina was used to be deposited on the patterned channel layer and channel protection layer by ALD at a temperature of 150° C., so that a gate insulating layer was formed to a thickness of 190 nm. Afterwards, the gate insulating layer was etched using a phosphoric acid solution heated up to 120° C. to be patterned. A gate electrode was deposited to a thickness of 150 nm on the gate insulating layer using ITO by sputtering, and the results were etched using a mixture solution of phosphoric acid and nitric acid at a temperature of 50° C. to be patterned, so that a thin film transistor was fabricated. Characteristics of the obtained transistor were evaluated, and the evaluated results are shown in FIG. 3. As confirmed from FIG. 3, SS was equal to 0.33, and mobility was 22.18 $cm^2/sV$.

Embodiment 2

Figure 4:
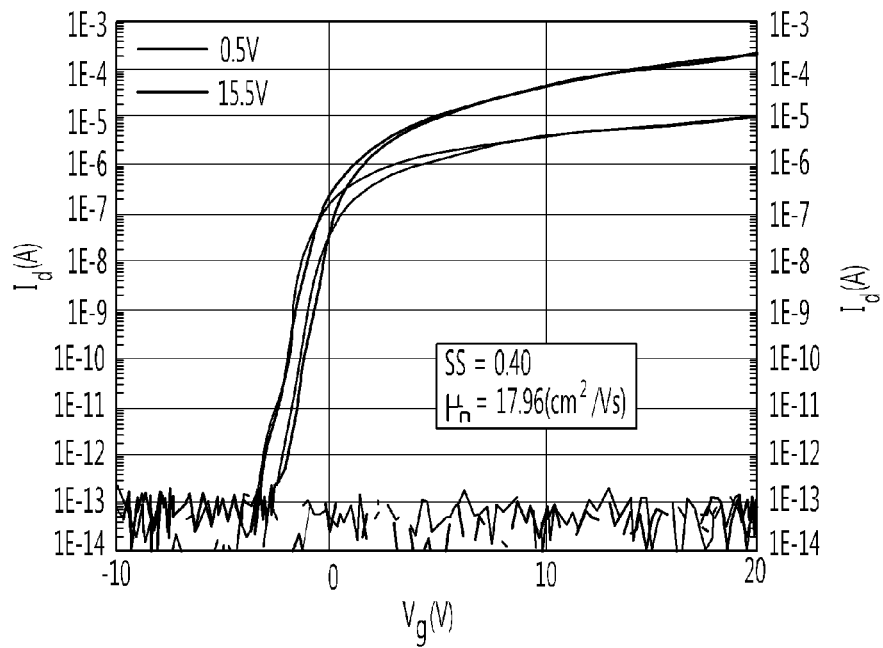
FIG. 4 is a transfer plot of a thin film transistor fabricated from Embodiment 2.

Source and drain electrodes were deposited to a thickness of 150 nm on a substrate by sputtering using ITO, and then patterned by etching at a temperature of 50° C. using a mixture solution of phosphoric acid and nitric acid. Afterwards, Zn—In—Sn—Al—O—N(Zn:In:Sn:Al atomic ratio=3:5:1:0.5) combined with AlN was deposited on the source and drain electrodes by sputtering at room temperature to form a Zn—In—Sn—O channel layer combined with AlN formed to a thickness of 20 nm Then, the resulting structure was annealed at a temperature of 400° C. for one hour. Then, a channel protection layer was formed to a thickness of 10 nm on the channel layer using alumina. Subsequently, the channel layer and the channel protection layer were wet etched using a diluted HF solution to be patterned. Then, alumina was used to be deposited on the patterned channel layer and channel protection layer by ALD at a temperature of 150° C., so that a gate insulating layer was formed to a thickness of 190 nm. Afterwards, the gate insulating layer was etched using a phosphoric acid solution heated up to 120° C. to be patterned. A gate electrode was deposited to a thickness of 150 nm on the gate insulating layer using ITO by sputtering, and the results were etched using a mixture solution of phosphoric acid and nitric acid at a temperature of 50° C. to be patterned, so that a thin film transistor was fabricated. Characteristics of the obtained transistor were evaluated, and the evaluated results are shown in FIG. 4. As confirmed from FIG. 4, SS was equal to 0.40, and mobility was 17.96 $cm^2/sV$.

It may be observed from the above embodiments that the thin film transistor in which an oxide semiconductor combined with AlN is used as the channel layer exhibits enhanced electrical characteristics.

As described above, the thin film transistor in which an oxide semiconductor combined with AlN is used as the channel layer has numerous applications, and may be used for designing various transparent circuits in addition to displays. For example, it may be used for a medical transparent display panel, an electronic circuit, UN PD, a transparent LED, a bi-directional transparent monitor panel, as a driving device of an LCD or OLED panel, a transparent RFID tag, a smart window that functions as both a transparent glass window and a display, a head-up display (HUD) of a car or airplane, a head mounted display (HMD) a general-purpose transparent display or a flexible, transparent display, etc.

The present invention exhibits the following effects.

First, a semiconductor thin film formed of an oxide semiconductor combined with a nitride exhibits increased mobility and improved electrical characteristics compared to a conventional semiconductor thin film, and increases usability of a device.

Second, a semiconductor thin film formed of an oxide semiconductor combined with a nitride according to the present invention exhibits stability at a high temperature, and thus can have high resistance against a temperature that may be caused during a process.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of fabricating a thin film transistor, comprising:
   forming source and drain electrodes, a channel layer, a gate insulating layer and a gate electrode on a substrate, wherein the channel layer is formed of a semiconductor thin film formed of an oxide semiconductor combined with a nitride containing boron or aluminum; and
   patterning the channel layer,
   wherein the nitride containing boron or aluminum is included such that the boron or aluminum exists within a range of 0.01 to 50 at % on the basis of the total atomic weight of metal atoms of an oxide semiconductor constituting the semiconductor thin film.

2. The method of claim 1, further comprising forming a channel protection layer on the channel layer using an insulating material, wherein the channel protection layer is patterned together with the channel layer.

3. The method of claim 1, wherein when the channel layer is formed, the oxide semiconductor is formed of at least one material selected from the group consisting of ZnO, In—Zn—O, Zn—Sn—O, In—Ga—ZnO, Zn—In—Sn—O, In—Ga—O and $SnO_2$.

4. The method of claim 2, wherein the channel protection layer is formed to a thickness of 1 nm to 20 nm using at least one insulating material selected from the group consisting of AlOx, SiNx and SiOx by chemical vapor deposition (CVD), atomic layer deposition (ALD) or sputtering.

5. The method of claim 1, wherein when the channel layer is patterned, the patterning is performed using photoresist, and etching is performed by dry or wet etching or ion milling.

6. The method of claim 2, wherein when the channel protection layer is patterned, the patterning is performed using photoresist, and etching is performed by dry or wet etching or ion milling.

7. A method of fabricating a thin film transistor, comprising:
   forming source and drain electrodes, a channel layer, a gate insulating layer and a gate electrode on a substrate, wherein the channel layer is formed of a semiconductor thin film formed of an oxide semiconductor combined with a nitride containing boron or aluminum; and
   patterning the channel layer,
   wherein the channel layer is formed by depositing the oxide semiconductor combined with the nitride containing boron or aluminum to a thickness of 5 to 100 nm by sputtering, pulsed laser deposition (PLD) or ion-beam deposition at room temperature to 300° C., and by performing post-annealing at a temperature below 600° C.

8. A method of fabricating a thin film transistor, comprising:
   forming source and drain electrodes, a channel layer, a gate insulating layer and a gate electrode on a substrate, wherein the entire channel layer comprises only mixed material formed by mixing an oxide semiconductor and a nitride, and the mixed material comes in direct contact with the gate insulating layer, and the nitride contains boron or aluminum; and
   patterning the channel layer.

* * * * *